United States Patent
Kongo et al.

(10) Patent No.: US 8,972,039 B1
(45) Date of Patent: Mar. 3, 2015

(54) STITCHWORK STATUS CHECKING SYSTEM, STITCHWORK STATUS CHECKING APPARATUS, STITCHWORK STATUS CHECKING METHOD AND STITCHWORK STATUS CHECKING PROGRAM

(71) Applicant: Janome Sewing Machine Co., Ltd., Hachioji-shi, Tokyo (JP)

(72) Inventors: Takeshi Kongo, Hachioji (JP); Yukio Hosaka, Hachioji (JP)

(73) Assignee: Janome Sewing Machine Co., Ltd., Hachioji-shu, Tokyo (JP)

( * ) Notice: Subject to any disclaimer, the term of this patent is extended or adjusted under 35 U.S.C. 154(b) by 0 days.

(21) Appl. No.: 14/141,750

(22) Filed: Dec. 27, 2013

(30) Foreign Application Priority Data

Aug. 8, 2013 (JP) ................................. 2013-165555

(51) Int. Cl.
| | |
|---|---|
| *G06F 19/00* | (2011.01) |
| *D05B 19/12* | (2006.01) |
| *D05B 59/00* | (2006.01) |

(52) U.S. Cl.
CPC ................ *D05B 19/12* (2013.01); *D05B 59/00* (2013.01)
USPC .......................................... 700/143; 700/136

(58) Field of Classification Search
USPC ........ 700/136–138, 143; 112/470.01, 470.04, 112/475.18, 475.19, 271
See application file for complete search history.

(56) References Cited

U.S. PATENT DOCUMENTS

| | | | |
|---|---|---|---|
| 5,144,900 A * | 9/1992 | Takahashi ..................... | 700/136 |
| 5,921,194 A | 7/1999 | Komuro et al. | |
| 6,216,618 B1 * | 4/2001 | Goldberg et al. ............. | 700/138 |
| 6,445,970 B1 * | 9/2002 | Hedman et al. ............... | 700/138 |
| 6,678,573 B2 * | 1/2004 | Tamai .......................... | 700/136 |
| 8,175,850 B2 * | 5/2012 | Nelson et al. ................ | 700/143 |
| 2001/0004717 A1 | 6/2001 | Zhang et al. | |
| 2003/0056702 A1 * | 3/2003 | Tamai ....................... | 112/470.01 |
| 2003/0065418 A1 * | 4/2003 | Kwak .......................... | 700/138 |
| 2005/0060058 A1 | 3/2005 | Cameron et al. | |
| 2011/0120359 A1 * | 5/2011 | Sekine ........................ | 112/102.5 |
| 2012/0245727 A1 | 9/2012 | Naka et al. | |
| 2013/0049938 A1 * | 2/2013 | Hooke ......................... | 340/12.5 |

FOREIGN PATENT DOCUMENTS

JP H-564694 A 3/1993

OTHER PUBLICATIONS

European Search Report for corresponding EP21067904 ; Mar. 27, 2014; Munich, Germany.

* cited by examiner

*Primary Examiner* — Nathan Durham
(74) *Attorney, Agent, or Firm* — Nath, Goldberg & Meyer; Jerald L. Meyer

(57) ABSTRACT

A stitchwork status checking apparatus includes a stitchwork data receiver unit that receives stitchwork data on a stitchwork pattern selected and currently stitched by a sewing machine, a converter unit that converts the received stitchwork data into a unique code, a status data receiver unit that receives a unique code converted based on the stitchwork data currently stitched by the sewing machine, and a code comparator unit that compares a code converted by the converter unit with a code received by the status data receiver unit. The stitchwork data receiver unit receives the stitchwork data through a transmission protocol that surely transmits data to a transmission destination. The status data receiver unit receives the code through a transmission protocol that transmits data to a transmission destination within a short time.

9 Claims, 10 Drawing Sheets

STITCHWORK STATUS CHECKING SYSTEM, STITCHWORK STATUS CHECKING APPARATUS, STITCHWORK STATUS CHECKING METHOD AND STITCHWORK STATUS CHECKING PROGRAM

BACKGROUND OF THE INVENTION

1. Field of the Invention

The subject matter of the present disclosure relates to a stitchwork status checking program, a stitchwork status checking apparatus, and a stitchwork status checking method which check the stitchwork status of a stitchwork pattern selected and stitched by a sewing machine. Moreover, the subject matter of the present disclosure also relates to a stitchwork status checking system including the stitchwork status checking apparatus.

2. Description of the Related Art

Conventionally, sewing machines that are capable of stitching have pattern data for stitchwork provided thereto, and perform stitching based on such pattern data. When a pattern is constituted by multiple threads, a user changes the thread as needed in accordance with such a pattern.

When a sewing machine starts stitching, the stitching is automatically performed without any operation by the user until the thread is changed next. When, for example, the pattern to be stitched is large, it takes over 30 minutes until the thread is changed next. Hence, the user estimates a time at which the sewing machine stops next, and returns to the sewing machine at this time.

Conversely, when the thread breaks during the stitching, the stitching is once terminated. When the user is not aware of the termination of the stitching, the sewing machine is left with the stitching being uncompleted. When the leaving time of the sewing machine as it is long, an extra time becomes necessary until the completion of the stitching. Accordingly, it is necessary for the user to return to the sewing machine several times, and to check that the stitching is being performed normally.

Checking of the stitchwork status by the sewing machine can be made if the status of the sewing machine is monitorable even if the user is apart from the sewing machine. Hence, JP H05-64694 A discloses a method of disposing a small CCD camera near a sewing machine, and of checking the video of how the sewing machine is performing stitching through a monitor connected in a wired manner.

When, however, the sewing machine and the monitor are connected in a wired manner, the movable range of the user is limited. Accordingly, instead of a wire connection, a wireless communication between the sewing machine and a portable information terminal is applicable. In this case, however, when the wireless communication through a normal data communication is applied, if the communication is once lost, an error is detected, and the connection is canceled. In this case, it is necessary for the user to manually establish a communication again.

In addition, when a video of stitching is transmitted to a personal computer or a portable information terminal via the wireless communication, the data quantity of such a video becomes remarkably large. Hence, a large load is applied to the hardware resources of the sewing machine, and thus it is necessary to provide an additional CPU or the like in order to process the video data.

Still further, transmission of the video data often occupies the wireless communication line, which may negatively affect other wireless communications. Moreover, when the portable information terminal becomes apart from the sewing machine and the communication status becomes poor, the video becomes fuzzy, and the motion image is terminated. When the communication status is recovered, the video is still fuzzy, and thus the visibility is poor.

The present disclosure has been proposed in order to address the above-explained conventional technical problems, and it is an objective of the present disclosure to provide a stitchwork status checking system, a stitchwork status checking apparatus, a stitchwork status checking method, and a stitchwork status checking program which enable a realtime monitoring of the progress situation of a stitching by a sewing machine on a screen of the stitchwork status checking apparatus while letting the stitching sewing machine and the stitchwork status checking apparatus to be connected with each other via a wireless network.

SUMMARY OF THE INVENTION

To accomplish the above objective, an aspect of the present disclosure provides a stitchwork status checking apparatus that checks a stitchwork status of a stitchwork pattern selected and currently stitched by a sewing machine. The stitchwork status checking apparatus includes: a stitchwork data receiver unit that receives stitchwork data on the stitchwork pattern currently stitched by the sewing machine; a converter unit that converts the received stitchwork data into a unique code; a status data receiver unit that receives a unique code converted based on the stitchwork data currently stitched by the sewing machine; and a code comparator unit that compares a code converted by the converter unit with a code received by the status data receiver unit. The stitchwork data receiver unit receives the stitchwork data through a transmission protocol that surely transmits data to a transmission destination, and the status data receiver unit receives the code through a transmission protocol that transmits data to a transmission destination within a short time.

The stitchwork status checking apparatus may further include a stitchwork data request unit that requests the stitchwork data currently stitched to the sewing machine when the code comparator unit determines that the two codes are inconsistent with each other.

The status data receiver unit may receive status data containing the unique code converted based on the stitchwork data currently stitched by the sewing machine, and a number of stitches after the sewing machine starts stitching, and the stitchwork status checking apparatus may further include a drawer unit that draws a stitchwork status by the sewing machine based on the stitchwork data stored in the memory, and the number of stitches after the sewing machine starts stitching when the code comparator unit determines that the two codes are consistent with each other.

The unique code converted based on the stitchwork data may be CRC codes.

The drawer unit may store the number of stitches contained in the status data every time the status data is received, and the stitchwork status checking apparatus may further include a drawing speed setting unit that sets a drawing speed based on a difference in the number of stitches and a status data receiving cycle.

The stitchwork status checking apparatus may further include a status data request unit that requests the status data to the sewing machine at a predetermined cycle even if the status data receiver unit or the stitchwork data receiver unit receives no data.

Other aspects of the present disclosure also provide a stitchwork status checking system including the stitchwork status checking apparatus, a stitchwork status checking method, and a control program for the stitchwork status checking apparatus.

According to the present disclosure, it becomes possible to monitor the progress state of stitching by a sewing machine in a real-time manner at a remote location from the sewing machine.

In addition, since the stitchwork status checking apparatus has a good portability, the monitoring is not carried out at a stationary location, but the progress state of the stitching can be checked in a different room, and the monitoring can be made while a user is moving. with respect to the communication scheme between the sewing machine and the stitchwork status checking apparatus, in order to suppress a communication error, when stitchwork data is transferred, a different communication scheme from that of the case in which the progress state of the stitching is monitored is applied. Accordingly, the stitchwork data can be surely transferred, and the data for monitoring the progress state can be transmitted at a little data quantity.

Still further, a radio wave cannot reach the stitchwork status checking apparatus from the sewing machine, the count value of the number of stitches and the drawing of the stitching are not updated. Conversely, when the radio wave condition becomes good again, and a communication is re-established, the current stitchwork status is immediately and correctly displayed.

DETAILED DESCRIPTION OF THE PREFERRED EMBODIMENTS

Figure 1:
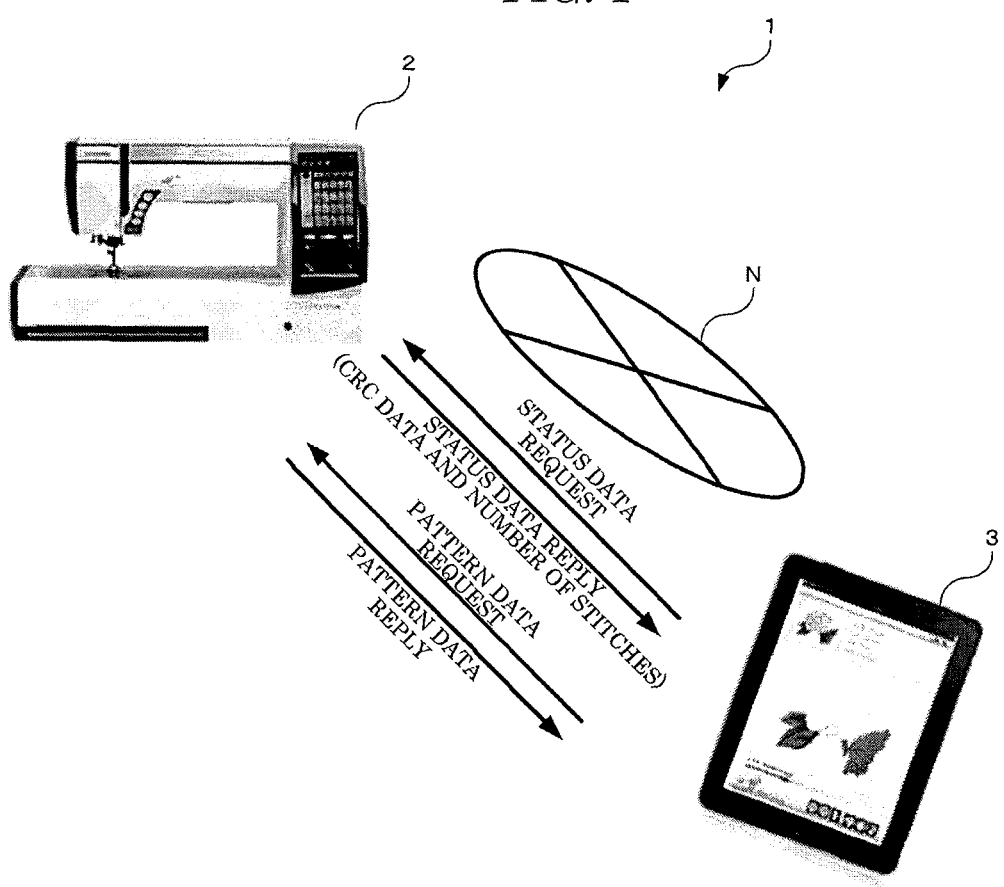
FIG. 1 is a schematic view illustrating a whole configuration of a stitchwork status checking system according to a first embodiment of the present disclosure.

A detailed explanation will be given of a stitchwork status checking system according to an embodiment of the present disclosure with reference to FIGS. 1 to 4. The explanation for a duplicated portion with the same reference numeral in respective figures will be omitted.

1. First Embodiment

1-1. Outline

As illustrated in FIG. 1, a stitchwork status checking system 1 includes a sewing machine 2 and a stitchwork status checking apparatus 3. The sewing machine 2 and the stitchwork status checking apparatus 3 are connected with each other via a wireless network N. The sewing machine 2 and the stitchwork status checking apparatus 3 exchange following signals and data.

(1) Status data request signal from the stitchwork status checking apparatus 3 to the sewing machine 2.

(2) Status data from the sewing machine 2 to the stitchwork status checking apparatus 3 in accordance with the status data request.

(3) Stitchwork data request signal from the stitchwork status checking apparatus 3 to the sewing machine 2.

(4) Stitchwork data from the sewing machine 2 to the stitchwork status checking apparatus 3 in accordance with the stitchwork data request.

According to the stitchwork status checking system 1 of this embodiment, the request signals or data of (1) to (4) are exchanged between the sewing machine 2 and the stitchwork status checking apparatus 3. At this time, the status data of (2) and the stitchwork data of (4) are exchanged through different communication protocols. That is, the status data of (2) is transmitted through a transmission protocol that can transmit data to a transmission destination within a short time. In addition, the stitchwork data of (4) is transmitted through a transmission protocol that can transmit data to the transmission destination precisely. According to this embodiment, an explanation will be given of an example case in which the status data of (2) is exchanged through a UDP communication protocol, while the stitchwork data of (4) is exchanged through a TCP communication protocol.

1-2. Sewing Machine

Figure 2:
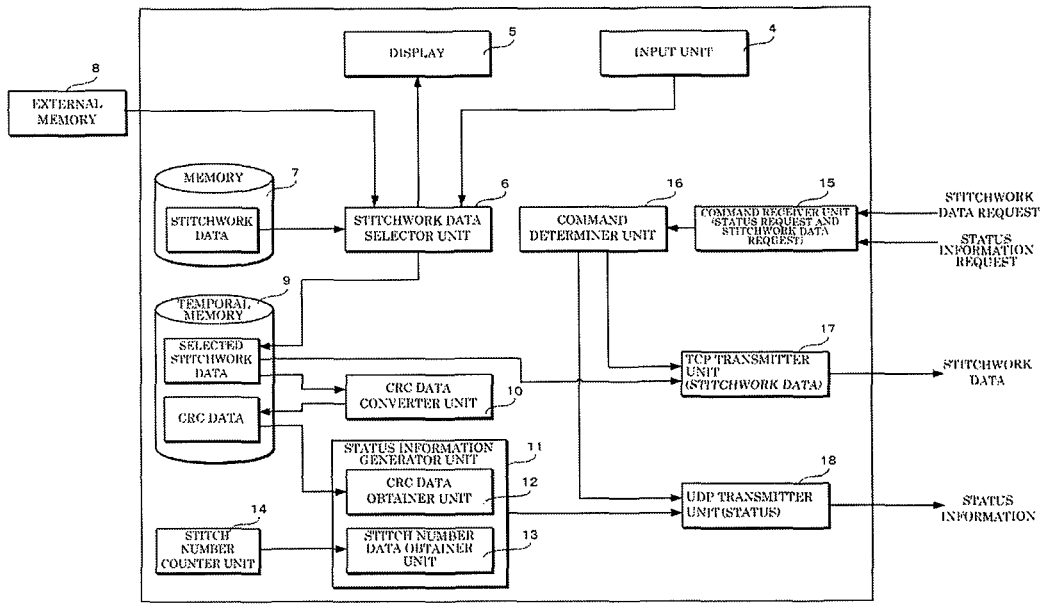
FIG. 2 is a block diagram illustrating a structure at a sewing-machine end in the stitchwork status checking system of the first embodiment of the present disclosure.

The sewing machine 2 is capable of stitching by performing a stitchwork based on stitchwork data input by a user, and is connected with the stitchwork status checking apparatus 3 via the wireless communication network N. As illustrated in FIG. 2, the sewing machine 2 includes an input unit 4, a display 5, a stitchwork data selector unit 6, a memory 7, an external memory 8, a temporal memory 9, a CRC data converter unit 10, a status information generator unit 11, a stitch number counter unit 14, a command receiver unit 15, a command determiner unit 16, a TCP transmitter unit 17, and a UDP transmitter unit 18.

The input unit 4 is to allow the user to input, for example, an operation request to the sewing machine 2 and a setting of the stitchwork data. The input unit 4 includes input devices, such as a mouse, a touch screen (including one installed in the display 5), and a keyboard.

The display 5 is to display screens for letting the user check, for example, the operation detail of the sewing machine 2, and the stitchwork data. The display 5 can be a display device, such as an LCD or a CRT. The display 5 displays candidate patterns when a stitching is performed.

The stitchwork data selector unit 6 selects stitchwork data corresponding to a pattern selected by the user and to be stitched. The stitchwork data selector unit 6 can refer to the contents of the memory 7 in the sewing machine 2 and the external memory 8. The memory 7 is a so-called ROM, and can be used as a non-volatile memory. This memory 7 stores the stitchwork data. In addition, the external memory 8 is, for example, a USB having a memory area therein, and stores the stitchwork data in the memory area.

The stitchwork data stored in the memory 7 and the external memory 8 is necessary data for the sewing machine 2 to perform stitching, and includes pieces of information on a pattern to be stitched, the size of the pattern, the number of stitches necessary to complete the pattern, the color to be applied, and a timing of the thread change. The stitchwork data is data with a size of substantially several hundred kilo bytes.

When the user selects a pattern to be stitched, the stitchwork data selector unit 6 displays on the display 5 patterns based on stitchwork data stored in the memory 7 or the external memory 8. The user operates the input unit 4, and selects a desired pattern among the patterns displayed on the display 5. The stitchwork data selector unit 6 outputs the stitchwork data of the pattern selected by the user to the temporal memory 9.

The temporal memory 9 stores, as selected stitchwork data, the stitchwork data selected by the stitchwork data selector unit 6. The temporal memory 9 is a so-called RAM, and can be used as a so-called volatile memory.

The CRC data converter unit 10 converts the selected stitchwork data stored in the temporal memory 9 into CRC codes. The conversion of the CRC codes is performed by outputting the bit sequence of the selected stitchwork data as, for example, the values of 16-bit integers. With respect to the CRC codes, always the same CRC codes are generated from the same selected stitchwork data. Hence, when even a 1 byte differs between the two selected stitchwork data, completely different codes as the CRC codes are generated. The converted CRC data by the CRC data converter unit 10 is stored in the temporal memory 9 as CRC data corresponding to the selected stitchwork data.

The status information generator unit 11 generates status data containing the CRC data stored in the temporal memory 9 and the number of stitches performed by the sewing machine 2 with respect to the currently stitching pattern. The status data contains the selected stitchwork data and stitch number data. The status data is data with a size of substantially 10 bytes. The status information generator unit 11 includes a CRC data obtainer unit 12 and a stitch number data obtainer unit 13.

The CRC data obtainer unit 12 obtains the CRC data stored in the temporal memory 9. The stitch number data obtainer unit 13 is connected with the stitch number counter unit 14, and obtains, as the stitch number data, the number of stitches counted by the stitch number counter unit 14. The stitch number counter unit 14 counts the number of stitches performed until the stitch number data is obtained after the sewing machine 2 starts stitching. The stitch number counter unit 14 is disposed so as to be connected with a motor that moves a needle up and down, and counts the number of stitches performed based on the rotation of the motor.

The command receiver unit 15 receives a command transmitted from the stitchwork status checking apparatus 3. The command transmitted from the stitchwork status checking apparatus 3 contains the status request signal and the stitchwork data request signal. The command receiver unit 15 always stands by in a status receivable of a command while the sewing machine 2 is in operation.

The command determiner unit 16 determines whether the command received by the command receiver unit 15 is the "stitchwork data request signal" or the "status data request signal". In the case of the "stitchwork data request signal", the command determiner unit 16 transmits, to the TCP transmitter unit 17, a transmission instruction of the "stitchwork data". In the case of the "status data request signal", the command determiner unit 16 transmits, to the UDP transmitter unit 18, a transmission instruction of the "status data".

The TCP transmitter unit 17 performs a TCP transmission with a TCP receiver unit 29 of the stitchwork status checking apparatus 3 to be discussed later via the wireless network N. The TCP transmitter unit 17 reads the "selected stitchwork data" stored in the temporal memory 9 based on the transmission instruction of the "stitchwork data" from the command determiner unit 16, and transmits the read data through a TCP communication. The TCP transmission is a communication protocol that establishes a connection prior to the communication and builds up a virtual communication line between the terminals performing the communication before the data transmission. Features of such a protocol are that a retransmission process is performed in this protocol, and it is guaranteed that the transmitted data is surely delivered and the pieces of the transmitted data are delivered in the transmission order. Hence, the transmission reliability is high.

The UDP transmitter unit 18 performs a UDP transmission with a UDP receiver unit 31 of the stitchwork status checking apparatus 3 to be discussed later via the wireless network N. The UDP transmitter unit 18 reads the "status data" generated by the status information generator unit 11 based on the transmission instruction of the "status data" from the command determiner unit 16, and transmits the read data through a UDP communication. This UDP transmission is based on a very simple protocol, the transmission is performed only once and no retransmission is performed, and thus it is not guaranteed that the transmitted data is surely delivered to the communication party. There is a possibility that the data is lost in the halfway, but it is a communication protocol applied when necessary to increase the transmission speed. This UDP transmission is advantageous when it is desired to transmit data in a real-time manner.

1-3. Stitchwork Status Checking Apparatus

Figure 3:
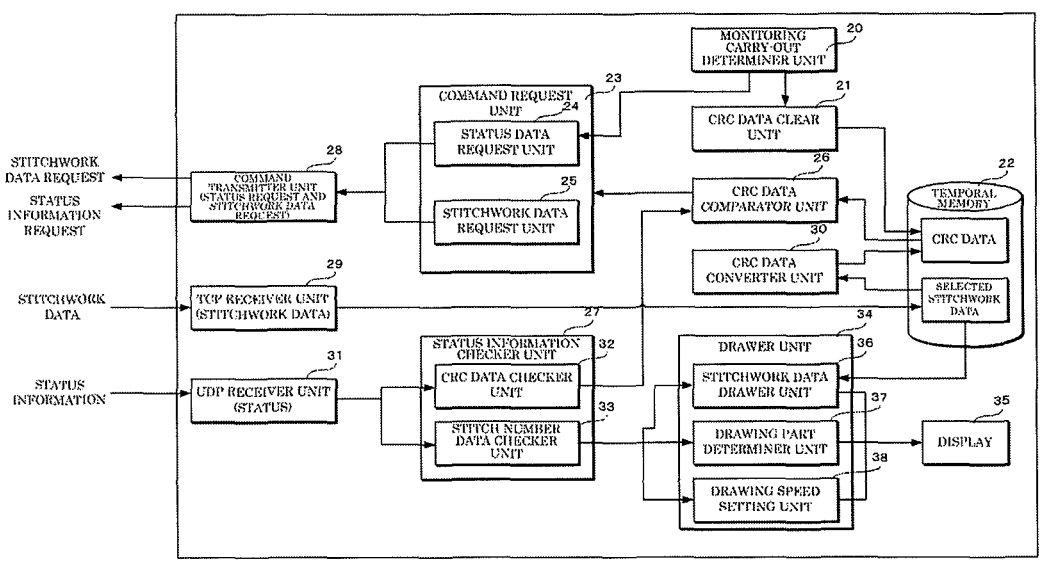
FIG. 3 is a block diagram illustrating a structure at a stitchwork-status-checking-apparatus end in the stitchwork status checking system of the first embodiment of the present disclosure.

The stitchwork status checking apparatus 3 transmits, to the sewing machine 2, a command that is the "stitchwork data request signal" or the "status data request signal". Moreover, the stitchwork status checking apparatus 3 receives the "stitchwork data" or the "status data" transmitted from the sewing machine 2 in response to such a command. The stitchwork status checking apparatus 3 draws the stitchwork status by the sewing machine 2 on a display 35 based on the received data. An example stitchwork status checking apparatus 3 is a general-purpose portable information terminal PDA (Personal Digital Assistant). As illustrated in FIG. 3, the stitchwork status checking apparatus 3 includes a monitoring carry-out determiner unit 20, a CRC data clear unit 21, a temporal memory 22, a command request unit 23, a CRC data comparator unit 26, a status information checker unit 27, a command transmitter unit 28, a TCP receiver unit 29, a CRC data converter unit 30, a UDP receiver unit 31, a drawer unit 34, and the display 35. The temporal memory 22 stores the selected stitchwork data and the CRC data.

The monitoring carry-out determiner unit 20 determines, by the stitchwork status checking apparatus 3, the start of the monitoring of the stitching by the sewing machine 2. With respect to the start of the monitoring, when the power switch of the stitchwork status checking apparatus 3 is turned ON, when a monitoring application in the stitchwork status checking apparatus 3 is activated, and when a "synchronization" button in the monitoring application is depressed, it is determined that the monitoring starts.

The CRC data clear unit 21 erases the CRC data stored in the temporal memory 22 when the monitoring carry-out determiner unit 20 determines that the monitoring starts.

The command request unit 23 outputs a signal of requesting the stitchwork data or the status data to the sewing machine 2. The command request can be performed at an arbitrary cycle. The shorter the command request cycle is, the finer the stitching by the sewing machine 2 displayed on the stitchwork status checking apparatus 3 becomes. For example, the command request is performed for each 0.5 seconds. The command request unit 23 includes a status data request unit 24 and a stitchwork data request unit 25.

The status data request unit 24 requests the "status data" in the following conditions of (1) and (2).

(1) When the monitoring carry-out determiner unit 20 determines that the monitoring starts.

(2) When a comparison result that the CRC data stored in the temporal memory 22 is consistent with the CRC data checked by the status information checker unit 27 is input from the CRC data comparator unit 26 to be discussed later to the command request unit 23.

The stitchwork data request unit 25 requests the "stitchwork data" when a comparison result that the CRC data stored in the temporal memory 22 is different from the CRC data checked by the status information checker unit 27 is input from the CRC data comparator unit 26 to the command request unit 23.

The command transmitter unit 28 transmits, to the sewing machine 2, the signal of the "stitchwork data request" or the "status information request" from the command request unit 23. The command transmitter unit 28 transmits a command when the command request unit 23 requests a command.

The TCP receiver unit 29 receives the "selected stitchwork data" transmitted by the TCP transmitter unit 17 of the sewing machine 2 through the TCP communication. This "selected stitchwork data" is stored in the temporal memory 22 of the stitchwork status checking apparatus 3.

The CRC data converter unit 30 converts the selected stitchwork data stored in the temporal memory 22 into the CRC codes like the CRC data converter unit 10 of the sewing machine 2. The CRC codes converted by the CRC data converter unit 30 are stored in the temporal memory 22 as the CRC data corresponding to the selected stitchwork data. The UDP receiver unit 31 receives the "status data" transmitted by the UDP transmitter unit 18 of the sewing machine 2 through the UDP communication.

The status information checker unit 27 includes a CRC data checker unit 32 that reads the "status data" received by the UDP receiver unit 31, and extracts the "CRC data" contained in the "status data", thereby checking the "CRC data", and a stitch number data checker unit 33 that extracts the "stitch number data" to check the "stitch number data".

The CRC data comparator unit 26 compares the CRC data stored in the temporal memory 22 with the CRC data checked by the status information checker unit 27. The comparison result is output to the command request unit 23.

The drawer unit 34 draws image data to be displayed on the display 35 based on the "selected stitchwork data" stored in the temporal memory 22, and the "stitch number data" checked by the stitch number data checker unit 33 of the status information checker unit 27. The drawer unit 34 includes a stitchwork data drawer unit 36, a drawing part determiner unit 37, and a drawing speed setting unit 38.

Figure 4:
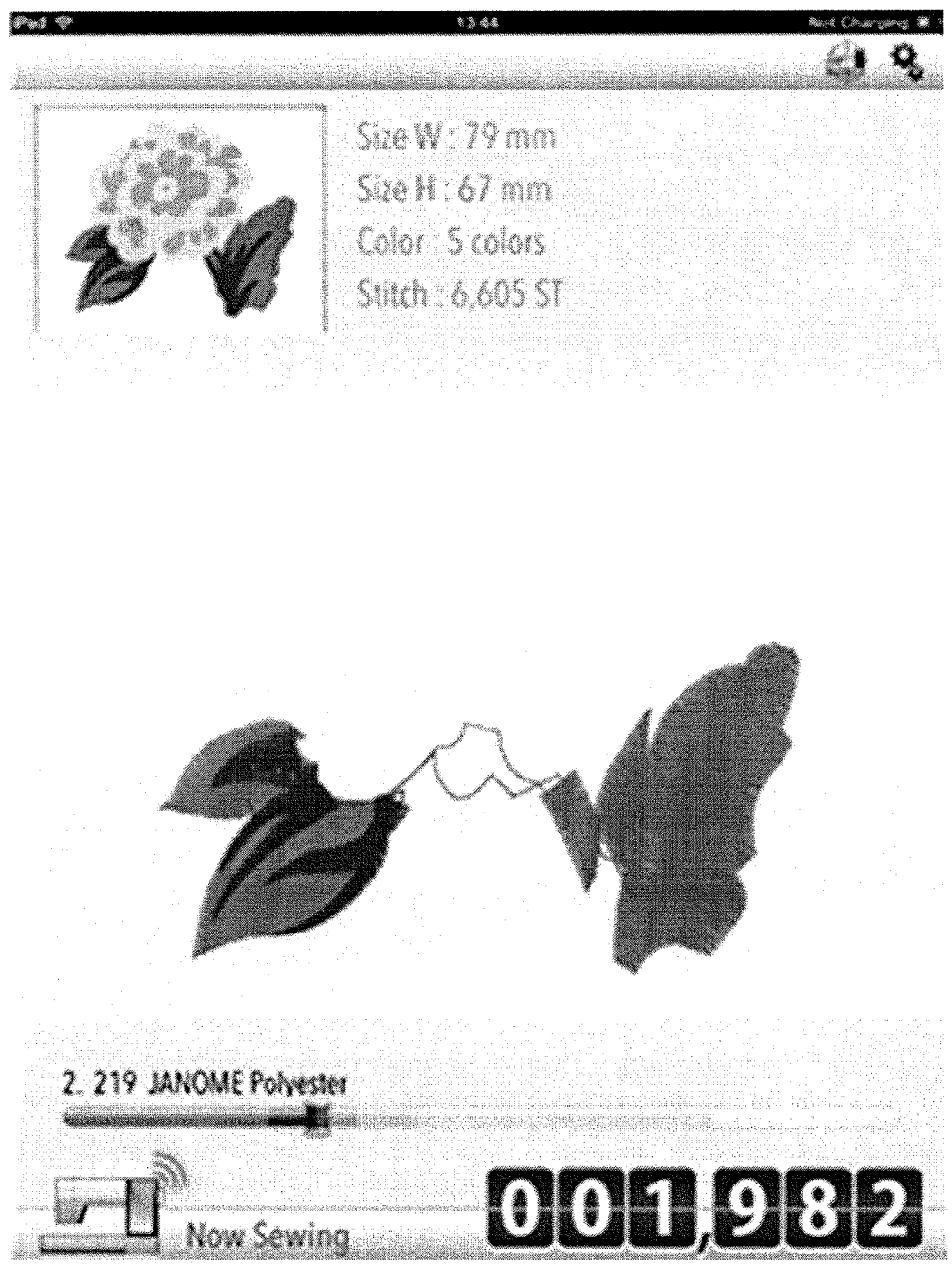
FIG. 4 is a diagram illustrating an example display of the stitchwork status checking apparatus in the stitchwork status checking system of the first embodiment of the present disclosure.

The stitchwork data drawer unit 36 performs drawing based on the "selected stitchwork data" and the "stitch number data". FIG. 4 is a diagram illustrating example image data displayed on the display 35. The stitchwork data drawer unit 36 performs following drawing based on information contained in the "selected stitchwork data".

(1) Draw a completion drawing based on information on the pattern to be stitched.

(2) Draw a necessary number of stitches up to completion based on information on the necessary number of stitches to complete the pattern.

(3) Draw the size of a completed stitching based on information on the size of the pattern.

(4) Draw the number of colors of threads to be used based on information on the applied colors.

(5) Draw a thread used up to a completion and a bar indicating the number of stitches performed with such a thread based on information on a timing of a thread change.

In addition, the stitchwork data drawer unit 36 performs following drawing based on information contained in the "stitch number data".

(6) Draw a current number of stitches after the start of stitching.

The drawing part determiner unit 37 draws which part of the selected stitchwork data the sewing machine 2 is stitching based on the current "stitch number data" and the "selected stitchwork data".

The drawing speed setting unit 38 sets the drawing speed based on a difference in the "stitch number data". The drawing speed setting unit 38 stores the "stitch number data" received last time, and calculates a difference from the "stitch number data" newly received. As an example, the drawing cycle for each stitching on the stitchwork status checking apparatus 3 changes in accordance with the rotation speed of the sewing machine 2, and thus the foregoing difference can be calculated based on the number of stitches increasing within a certain time. For example, when the number of stitches is obtained for each 0.5 seconds, if the "stitch number data" increases by five stitches from the previously obtained time, drawing is performed at 0.1 seconds per a stitching. This corresponds to 600 rotations/minute of the motor that moves the needle of the sewing machine 2 up and down. Moreover, when it increases by four stitches, drawing is performed at 0.125 seconds cycle per a stitching (corresponding to 45° rotations/minute). By setting the drawing cycle based on the increase in the number of stitches, the stitchwork status checking apparatus 3 can smoothly update the drawing.

1-4. Operations

A detailed explanation will be given of an operation of the stitchwork status checking system 1 of this embodiment employing the above-explained structure with reference to FIGS. 5 to 7. This system connects the sewing machine 2 and the stitchwork status checking apparatus 3 with each other via the wireless network N. Accordingly, the progress status of the stitching by the sewing machine can be monitored at a remote location from the sewing machine 2 through the display 35 of the stitchwork status checking apparatus 3. The operation of the sewing machine 2 and that of the stitchwork status checking apparatus 3 both configuring the stitchwork status checking system 1 will be explained separately.

(1) Operation at Sewing-Machine End

Figure 5:
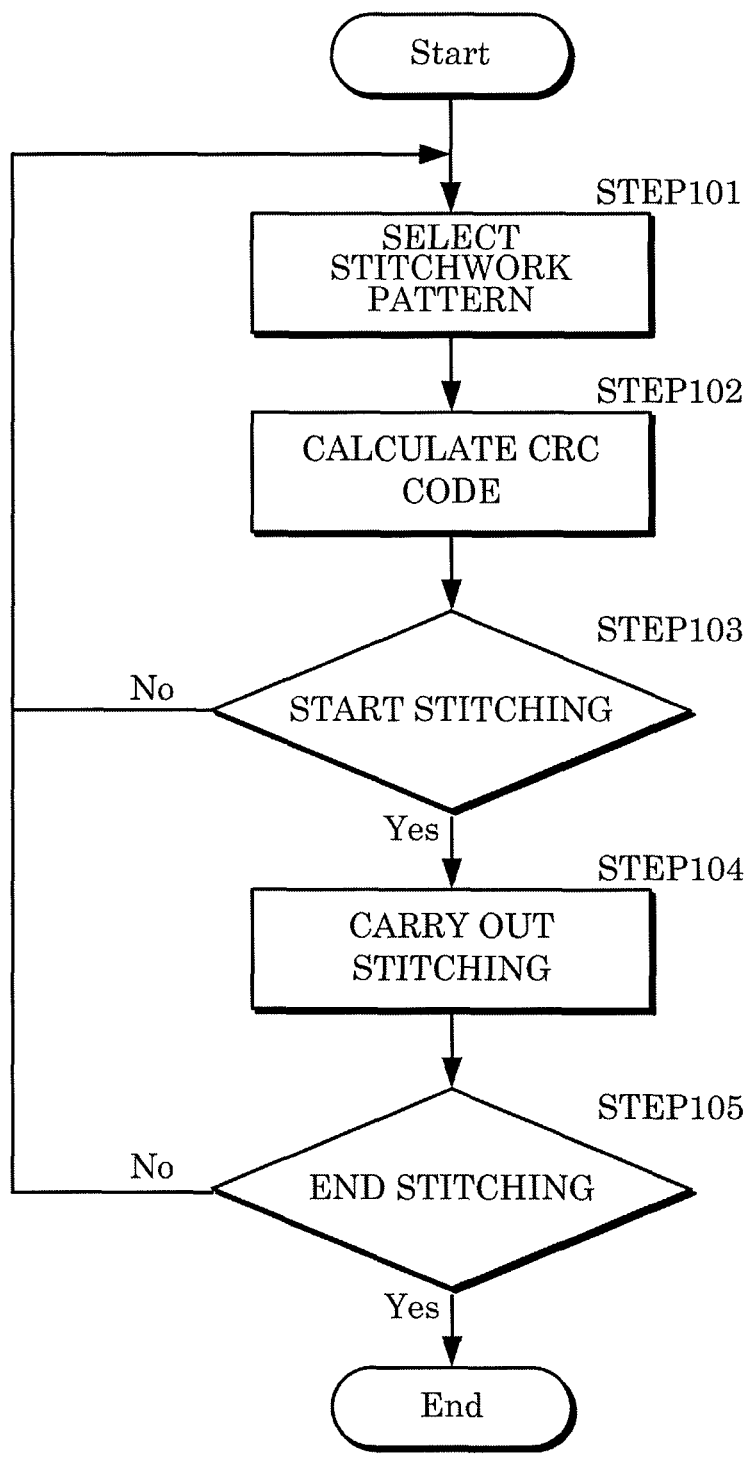
FIG. 5 is a flowchart illustrating procedures when the sewing machine performs stitching in the stitchwork status checking system of the first embodiment of the present disclosure.

FIG. 5 is a flowchart when the sewing machine 2 performs stitching. When the user causes the sewing machine 2 to stitch, the user selects a desired stitchwork pattern (step 101). The desired stitchwork pattern can be selected by selecting one of the candidates displayed on the display 5 of the sewing machine 2 through the input unit 4.

The stitchwork data corresponding to the selected stitchwork pattern is stored in the temporal memory 9 as the selected stitchwork data. The CRC data converter unit 10 calculates the CRC codes of the selected stitchwork data, and stores the calculated CRC codes in the temporal memory 9 as the CRC data (step 102).

Subsequently, after a cloth and specified threads are set in the sewing machine 2, the user depresses a stitchwork start button of the sewing machine 2 (step 103: YES). Accordingly, the sewing machine 2 starts stitching based on the selected stitchwork data.

After the stitching starts, the stitch number counter unit 14 counts the number of stitches from the beginning of the stitching during the stitching operation. With respect to the number of stitches, every time the stitch number counter unit 14 counts the number of stitches, the number of stitches stored in the memory of the stitch number counter unit 14 is updated (step 104). The counting of the number of stitches is continued until the end of the stitching operation.

The sewing machine 2 ends stitching after performing the stitching until the completion of the selected stitchwork data. Next, when another stitching is performed (step 105: NO), the user selects again a stitchwork pattern, and the sewing machine 2 stitches such a stitchwork pattern (steps 101 to 105). Conversely, when no other stitching is performed (step 105: YES), the sewing machine 2 terminates the stitching operation.

(2) Interruption Process in Sewing Machine 2

Figure 6:
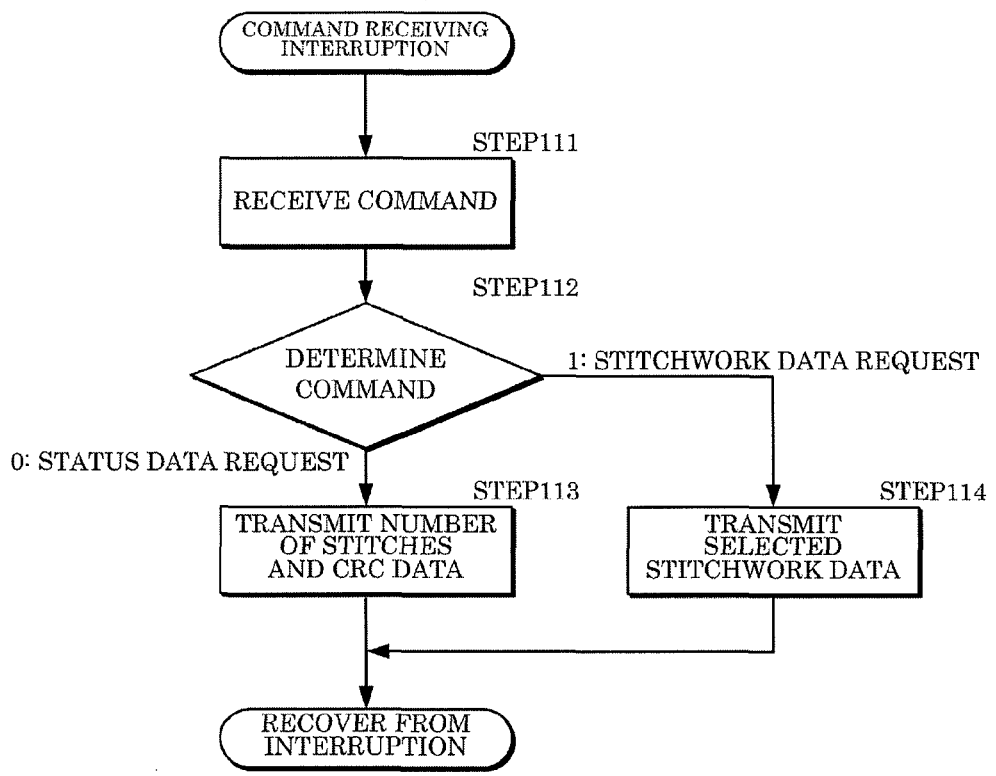
FIG. 6 is a flowchart illustrating a process when the sewing machine receives a command from the stitchwork status checking apparatus in the stitchwork status checking system of the first embodiment of the present disclosure.

FIG. 6 is a flowchart illustrating a process when the sewing machine 2 receives a command from the stitchwork status checking apparatus 3.

After the step 102 in the flowchart of FIG. 5 at which the CRC codes of the selected stitchwork data are calculated and are stored as the CRC data, the sewing machine 2 communicates with the stitchwork status checking apparatus 3 via the wireless network N as an interruption process. At this time, the command receiver unit 15 of the sewing machine 2 receives a command transmitted from the stitchwork status checking apparatus 3 (step 111).

When the command receiver unit 15 receives a command, the command determiner unit 16 determines whether the received command is the command of "stitchwork data request" or the command of "status information request" (step 112).

When the command is of "status data request" (step 112: 0), the UDP transmitter unit 18 transmits the status data generated by the status information generator unit 11 to the UDP receiver unit 31 of the stitchwork status checking apparatus 3 (step 113). This status data contains the CRC data obtained by converting the selected stitchwork data currently stitched into CRC codes, and the current number of stitches.

Conversely, when the command is of "stitchwork data request" (step 112: 1), the TCP transmitter unit 17 transmits the selected stitchwork data stored in the temporal memory 9 and currently stitched to the TCP receiver unit 29 of the stitchwork status checking apparatus 3 as the stitchwork data (step 114).

The sewing machine 2 accepts this interruption process until the stitching completes or until the power is turned OFF. When a new interruption process is accepted, the following steps are repeated after the step of receiving a command (step 111).

(3) Operation at Stitchwork-Status-Checking-Apparatus-3 End

Figure 7:
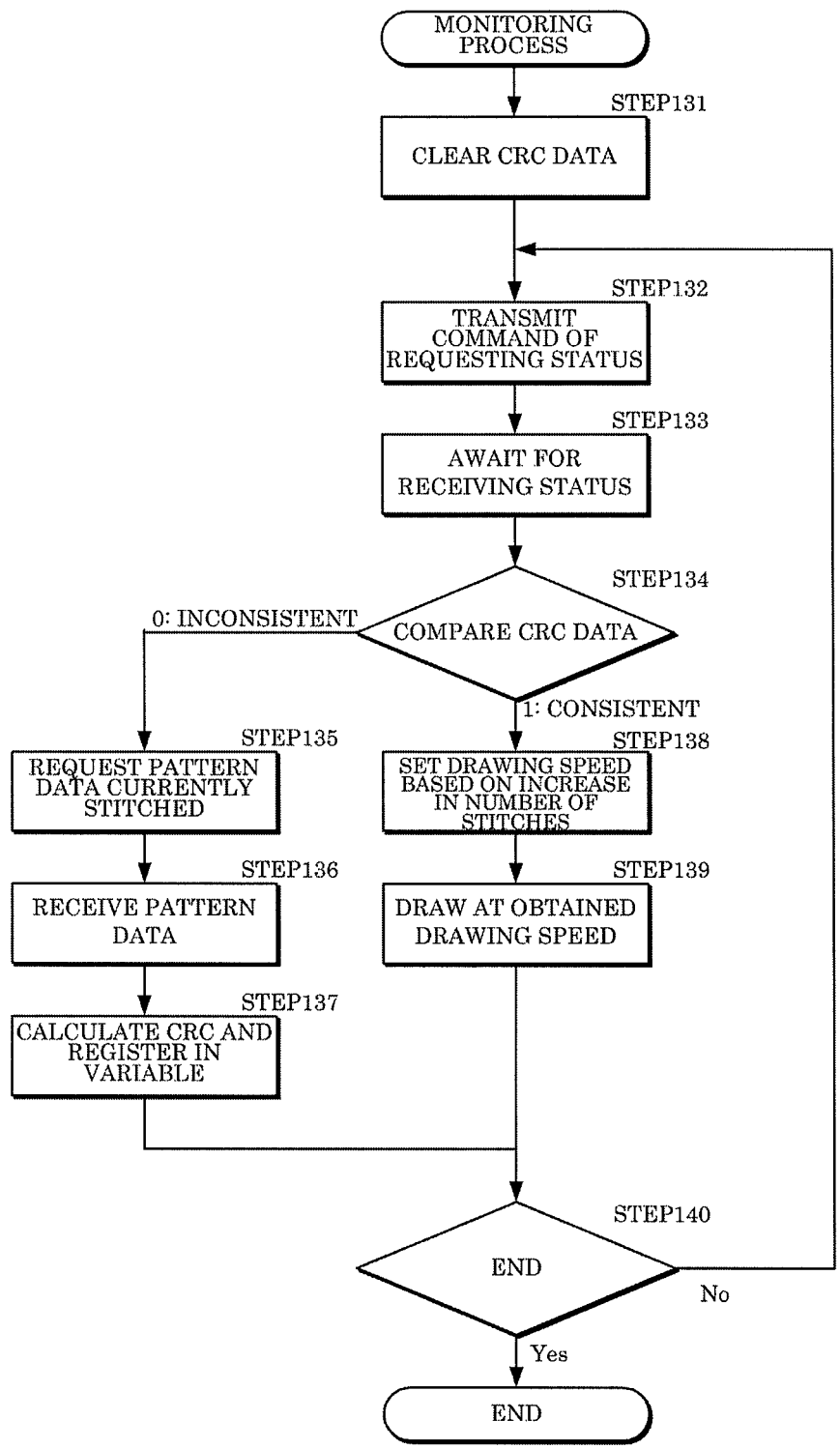
FIG. 7 is a flowchart illustrating procedures of a monitoring process by the stitchwork status checking apparatus in the stitchwork status checking system of the first embodiment of the present disclosure.

FIG. 7 is a flowchart when the stitchwork status checking apparatus 3 checks the stitchwork status. When the user checks the stitchwork status of the sewing machine 2 through the stitchwork status checking apparatus 3, the user launches the stitchwork status checking application installed in the stitchwork status checking apparatus 3.

When the monitoring process starts, the CRC data clear unit 21 erases the CRC data stored in the temporal memory 22 (step 131).

Subsequently, a request of the status data on the pattern currently stitched is made to the sewing machine 2 (step 132). The request of the status data is output by the status data request unit 24 of the command request unit 23, and is output to the sewing machine 2 through the command transmitter unit 28.

After the status data request is transmitted from the command transmitter unit 28, a reply with the status data from the sewing machine 2 based on the status data request is waited (step 133). When the UDP receiver unit 31 receives the status data from the sewing machine 2, the CRC data comparator unit 26 compares the CRC data contained in the received status data with the CRC data stored in the temporal memory 22 of the stitchwork status checking apparatus 3 (step 134).

When the CRC data received from the sewing machine 2 is inconsistent with the CRC data stored in the temporal memory 22 (step 134: 0), the status data request unit 24 of the command request unit 23 requests the stitchwork data currently stitched (step 135). Example cases in which the CRC data in the status data received from the sewing machine 2 is inconsistent with the CRC data stored in the temporal memory 22 are when the CRC data in the temporal memory 22 is erased at the beginning of the monitoring, and when the sewing machine 2 changes the selected stitchwork data.

After the command transmitter unit 28 transmits the stitchwork data request, a reply with the stitchwork data from the sewing machine 2 based on the stitchwork data request is waited (step 136). When receiving the stitchwork data from the sewing machine 2, the TCP receiver unit 29 stores the received stitchwork data in the temporal memory 22. The CRC data converter unit 30 calculates the CRC codes of the stored and selected stitchwork data, and stores the calculated CRC codes in the temporal memory 22 as CRC data (step 137).

Conversely, when the CRC data in the status data from the sewing machine 2 is consistent with the CRC data stored in the temporal memory 22 (step 134: 1), drawing is performed based on the stitch number data in the status data received from the sewing machine 2 and the selected stitchwork data stored in the temporal memory 22. The drawing speed of this drawing is set based on a difference between the stitch number data in the status data received from the sewing machine 2 and the stitch number data in the status data received last time (step 138). In this embodiment, the stitchwork status checking apparatus 3 inquires the current number of stitches of the sewing machine 2 for each 0.5 seconds. Hence, when a difference between the last and current numbers of stitching is five stitches, drawing is performed at a 0.1 seconds cycle for each stitching. Next, the drawer unit 34 performs drawing at this drawing speed (step 139).

The above-explained processes are continued until the end of the monitoring process (step 140: NO). In this embodiment, the steps 132, 133, 134, 138, 139, and 140 are repeated for each 0.5 seconds. Hence, a graphic display of the stitching synchronized with the actual stitching by the sewing machine can be expressed on the stitchwork status checking apparatus 3.

(4) Operation at the Beginning of Monitoring Process

Figure 8:
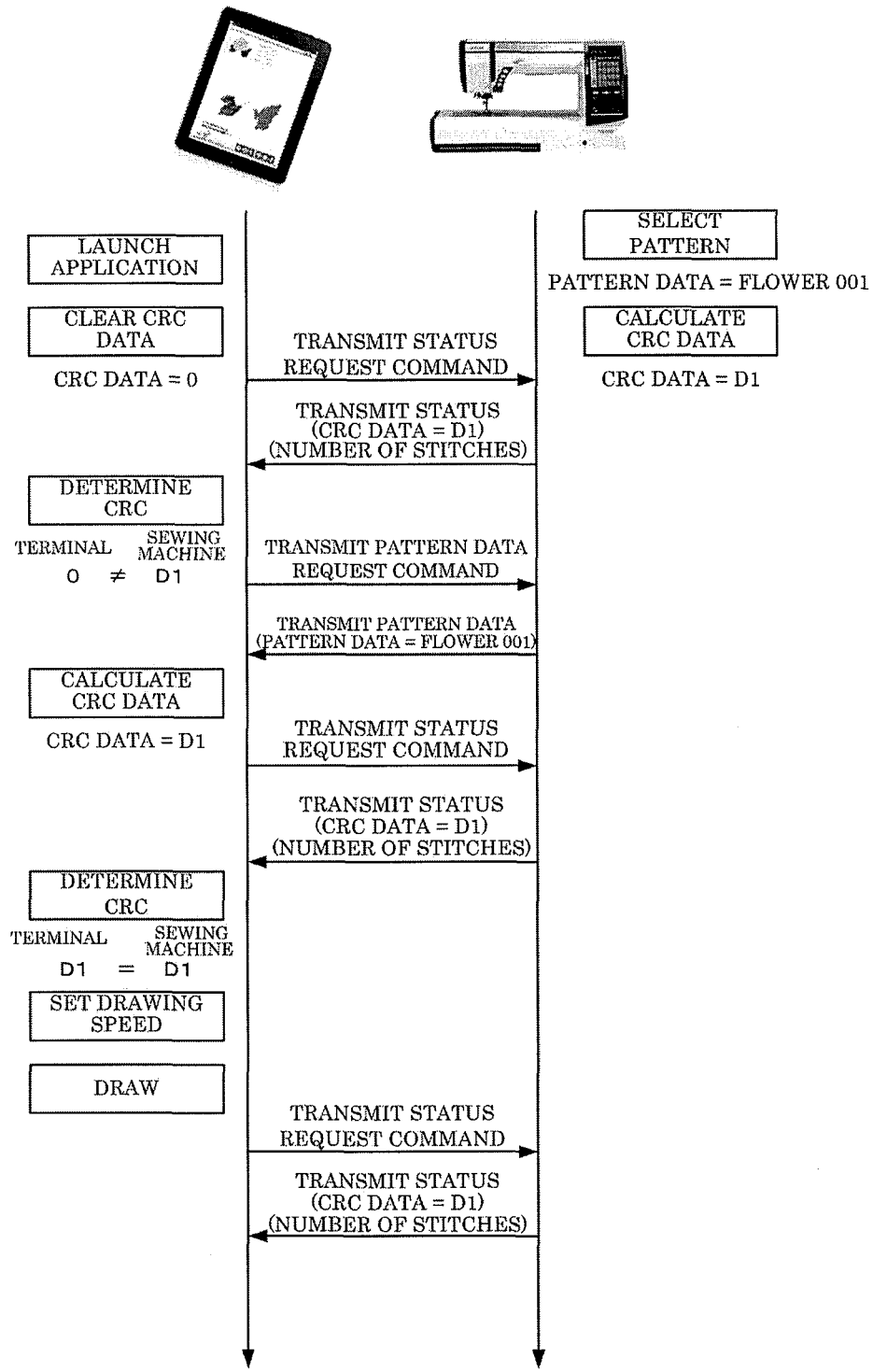
FIG. 8 is a sequence diagram when the stitchwork status by the sewing machine is checked in the stitchwork status checking system of the first embodiment of the present disclosure.

FIG. 8 is a sequence diagram when the stitchwork status checking apparatus 3 checks the stitchwork status of the sewing machine 2 in the stitchwork status checking system 1.

First, when the sewing machine 2 performs stitching, the user selects a pattern. When the user selects pattern data that is "flower 001", the pattern data "flower 001" is stored in the temporal memory 9 as the selected pattern data. Simultaneously, CRC codes "D1" calculated from the pattern data "flower 001" are stored in the temporal memory 9 as the CRC data.

Conversely, in order to let the stitchwork status checking apparatus 3 execute the monitoring process, the stitchwork status checking application installed in the stitchwork status checking apparatus 3 is launched. Hence, the monitoring process is started. When the monitoring process starts, the CRC data stored in the temporal memory 22 of the stitchwork status checking apparatus 3 is initialized (CRC data=0).

Subsequently, the stitchwork status checking apparatus 3 transmits a command of requesting the status data to the sewing machine 2. The sewing machine 2 receives this command, and replies the current status data. This status data contains the CRC data "D1".

The stitchwork status checking apparatus 3 receives the status data containing that CRC data, and compares such CRC data with the CRC data stored in the local memory. As a result, since the CRC data at the sewing-machine end is "D1" but the CRC data at the stitchwork-status-checking-apparatus-3 end is "0", it is determined that the CRC data is "inconsistent".

The stitchwork status checking apparatus 3 transmits a command of requesting the selected stitchwork data to the sewing machine 2 based on the CRC data comparison result that is "inconsistent". The sewing machine 2 receives this command, and replies the current selected stitchwork data. This selected stitchwork data is "flower 001".

The stitchwork status checking apparatus 3 receives this selected stitchwork data, and stores the received data in the temporal memory. Simultaneously, the stitchwork status checking apparatus 3 calculates the CRC codes from the pattern data "flower 001". When the communication is carried out normally, the CRC code should be D1, and "D1" is stored as the CRC data.

The stitchwork status checking apparatus 3 again transmits a command of requesting the status data, and the sewing machine 2 again replies the status data. Next, the stitchwork status checking apparatus 3 compares the CRC data in the status data from the sewing machine 2 with the CRC data "D1" stored in the local memory. As a result, since the CRC data at the sewing-machine-2 end is "D1" and the CRC data at the stitchwork-status-checking-apparatus-3 end is also "D1", it is determined that the CRC data is "consistent".

When it is determined that the CRC data is "consistent", the stitchwork status checking apparatus 3 performs drawing based on the received and selected stitchwork data "flower 001" and the number of stitches contained in the status data.

(5) Operation when Pattern is Selected at Sewing-Machine End

Figure 9:
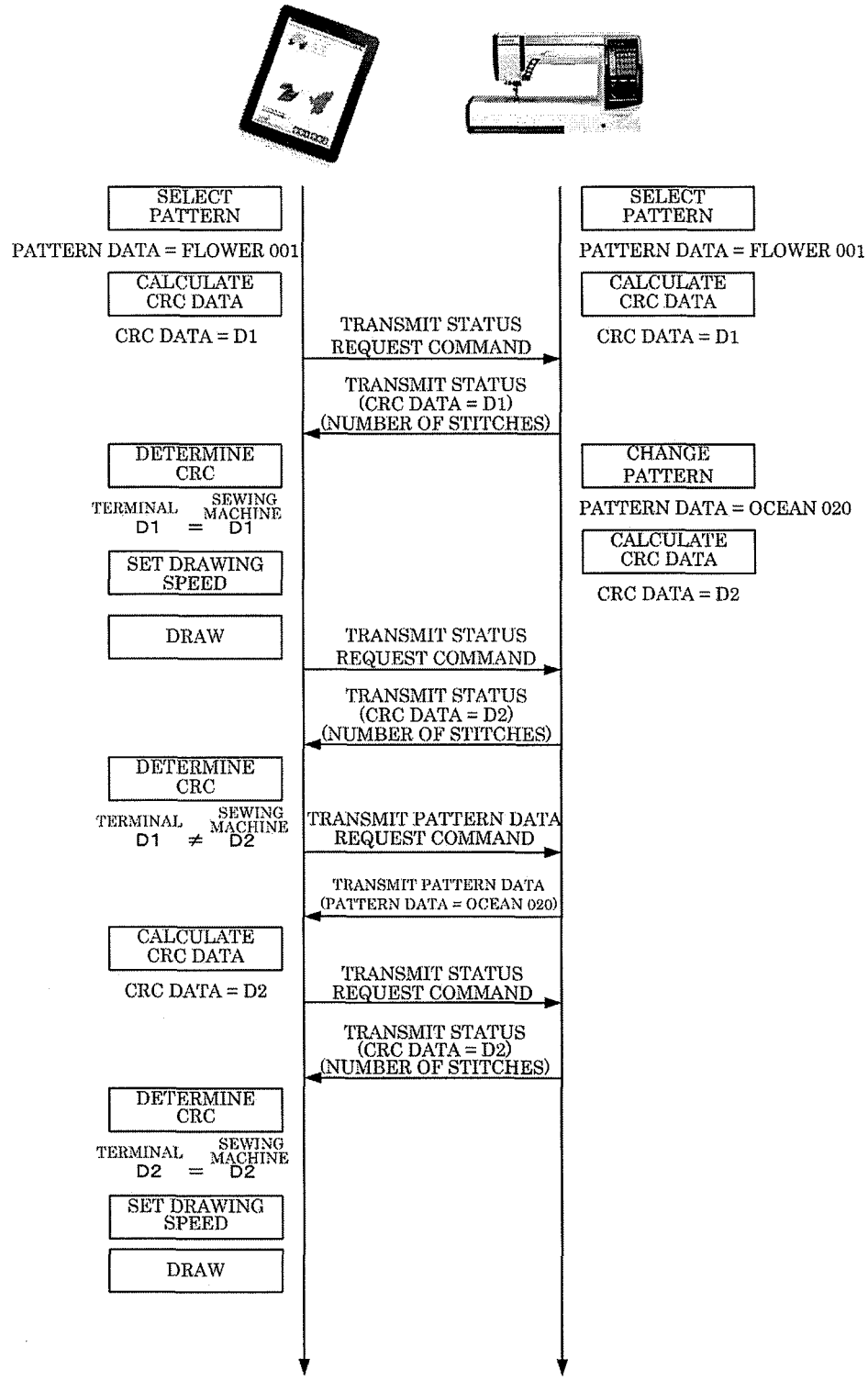
FIG. 9 is a sequence diagram when the stitchwork status by the sewing machine is checked in the stitchwork status checking system of the first embodiment of the present disclosure.

FIG. 9 is a sequence diagram when the stitchwork status checking apparatus 3 checks the stitchwork status by the sewing machine 2 when the selected pattern data is changed from "flower 001" to "ocean 020" at the sewing machine 2 in the stitchwork status checking system 1.

In the sewing machine 2, when stitching is performed based on the pattern data "flower 001", the selected pattern data "flower 001" and the CRC data "D1" thereof are stored in the sewing machine 2. Conversely, in the stitchwork status checking apparatus 3, the selected pattern data "flower 001" and the CRC data "D1" are also stored. Transmission of the request command of the status data and reply with the status data based on the former request are performed between the sewing machine 2 and the stitchwork status checking apparatus 3. The stitchwork status checking apparatus 3 performs drawing on the display 35 based on the selected pattern data "flower 001" and the "number of stitches" in the received status data.

In this condition, when the selected pattern data is changed from "flower 001" to "ocean 020" at the sewing machine 2, the sewing machine 2 stores the pattern data "ocean 020" as the selected pattern data. Simultaneously, CRC codes "D2" calculated from the pattern data "ocean 020" are stored as the CRC data.

When receiving a command of requesting the status data from the stitchwork status checking apparatus 3, the sewing machine 2 replies the status data containing the CRC data "D2".

The stitchwork status checking apparatus 3 receives the status data containing such CRC data, and compares this CRC data with the CRC data stored in the local memory. As a result, since the CRC data at the sewing-machine-2 end is "D2" and the CRC data at the stitchwork-status-checking-apparatus-3 end is "D1", it is determined that the CRC data is "inconsistent".

Based on the CRC data comparison result that is "inconsistent", the stitchwork status checking apparatus 3 transmits a command of requesting the selected stitchwork data to the sewing machine 2. The sewing machine 2 receives this command, and replies the current selected stitchwork data. This selected stitchwork data is "ocean 020".

The stitchwork status checking apparatus 3 receives this selected stitchwork data, and stores such data in the temporal memory 22. Simultaneously, the stitchwork status checking apparatus 3 calculates the CRC codes from the pattern data "ocean 020". When the communication is carried out normally, the CRC codes should be D2 and "D2" is stored as the CRC data.

Subsequently, transmission of a command of requesting the status data from the stitchwork status checking apparatus 3 and reply with the status data from the sewing machine 2 are performed again. Next, the stitchwork status checking apparatus 3 compares the CRC data in the status data from the sewing machine 2 with the CRC data stored in the local memory. As a result, since the CRC data at the sewing-machine-2 end is "D2" and the CRC data at the stitchwork-status-checking-apparatus-3 end is "D2", it is determined that the CRC data is "consistent".

When it is determined that the CRC data is "consistent", the stitchwork status checking apparatus 3 performs drawing based on the received and selected pattern data "ocean 020" and the number of stitches in the status data.

1-5. Advantageous Effects

The stitchwork status checking system 1 of the above-explained embodiment accomplishes the following advantages.

(1) A communication is carried out between the sewing machine 2 and the stitchwork status checking apparatus 3 via the wireless network N, enabling the user to check the stitchwork status of the sewing machine 2 through the stitchwork status checking apparatus 3. It is possible for the user to not only monitor the stitchwork status near the sewing machine 2 but also carry the stitchwork status checking apparatus 3 and go outside the communication range. When the communication is enabled again, the monitoring is immediately restarted, and thus a stitch drawing can be recovered correctly.

With respect to the communication via the wireless network N, two kinds of communication protocols that are the TCP protocol and the UDP protocol are applied. The TCP protocol needs a relatively large data transmission (several hundred kilobytes or so), but a transmission is performed while confirming whether the data is delivered to the communication counterparty, and thus a precise transmission is enabled. Accordingly, the stitchwork data is transmitted through the TCP protocol.

Conversely, the UDP protocol enables a communication through a relatively little data transmission (several ten bytes or so). During the monitoring, a transmission of several ten bytes is performed at a cycle of several hundred miliseconds, and thus the communication data quantity can be suppressed extremely little. In addition, since the UDP protocol is applied during the monitoring, if data is unreceivable, this packet is discarded, and a next data reception is awaited. That is, even if the communication is interrupted, the communication is not particularly terminated upon an error detection, a recovery to a normal communication is awaited, and when the normal communication is enabled again, a drawing process is restarted. That is, even if the communication is interrupted, it is easy to recover the communication once the normal communication is enabled again.

(2) The selected stitchwork data is stored in both of the temporal memory 9 of the sewing machine 2 and the temporal memory 22 of the stitchwork status checking apparatus 3. Moreover, instead of directly comparing the selected stitchwork data stored in the two memories 9 and 22, CRC codes calculated from the selected stitchwork data are compared. Accordingly, while the communication is interrupted for a long time, when the user changes the pattern to the next pattern, unique codes (e.g., CRC codes) to the pattern are possessed at both of the sewing-machine-2 end and the stitchwork-status-checking-apparatus-3 end, and when the sewing machine 2 notifies the stitchwork status checking apparatus 3 of such CRC codes, the codes are inconsistent, and thus it becomes possible for the stitchwork status checking apparatus 3 to recognize that the pattern is changed. When the change of the pattern is recognized, the stitchwork status checking apparatus 3 requests the pattern data currently stitched by the sewing machine 2, and receives the data from the sewing machine 2. The data communication in this case is performed through the TCP protocol, and thus the stitchwork data is surely delivered without any error. The TCP protocol lacks the real-time manner characteristics, but can surely transfer data to the stitchwork status checking apparatus 3. Accordingly, the data in the stitchwork status checking apparatus 3 can be surely replaced with data consistent with the data in the sewing machine 2, and thus the stitchwork status checking apparatus 3 can display the same pattern.

(3) With respect to the progress of stitching by the sewing machine 2, the stitching is graphically drawn on the stitchwork status checking apparatus 3 at a remote location. At this time, the actual stitching is synchronized with the graphic drawing. Hence, in the case of the fast stitching, the drawing is performed at a fast speed, and in the case of the slow stitching, the drawing is performed slowly. Accordingly, even if the user is apart from the sewing machine 2, it is possible for the user to easily grasp how the stitching is performed.

(4) Since the communication is performed with radio waves, the communication environment may become poor due to a radio wave intensity, a communication distance, and an obstacle like a wall. When, in particular, the user carries the stitchwork status checking apparatus 3, the communication may be interrupted temporarily. When the location is changed, or when the direction of the stitchwork status checking apparatus 3 is changed, the communication may be recovered frequently. While the communication is interrupted, the drawing by the stitchwork status checking apparatus 3 is interrupted, but when the communication is recovered, drawing is restarted up to the actual stitchwork status, and thus a synchronization between the sewing machine 2 and the stitchwork status checking apparatus 3 is established.

2. Other Embodiments

The embodiment of the present disclosure was explained above, but various omissions, replacements, and modifications are permitted without departing from the scope and spirit of the present disclosure. Such embodiments and changes are within the scope and spirit of the present disclosure, and are within the equivalent range to the subject matter recited in the appended claims.

Figure 10:
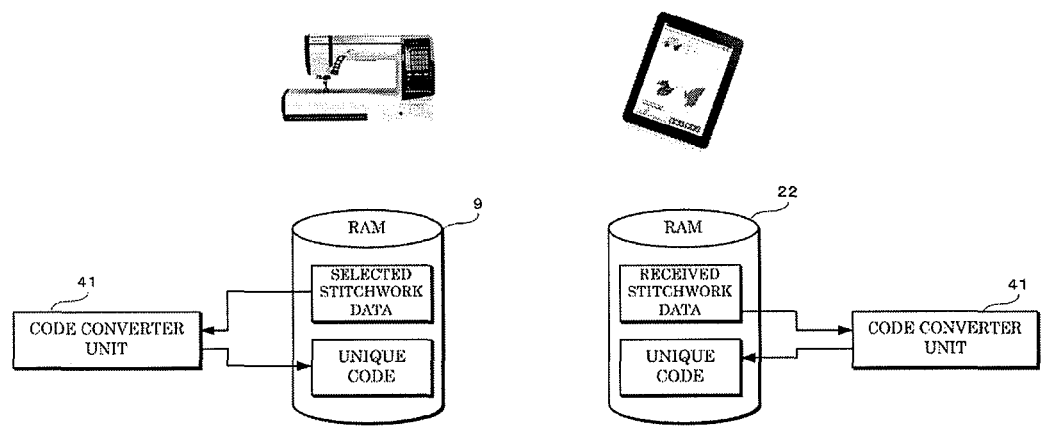
FIG. 10 is a block diagram illustrating conversion scheme of stitchwork data between the sewing machine and the stitchwork status checking apparatus in the stitchwork status checking system according to another embodiment of the present disclosure.

In the first embodiment, the CRC codes are calculated from the selected stitchwork data stored in the temporal memory of the sewing machine 2 and the temporal memory of the stitchwork status checking apparatus 3, and the calculated CRC codes are utilized as the CRC data. However, the pattern data may be converted in other data than the CRC data as long as such data is unique to the pattern data and has a smaller quantity than that of the pattern data. For example, as illustrated in FIG. 10, code converter units 41 that convert codes through the same scheme are provided for the respective temporal memories of the sewing machine 2 and the stitchwork status checking apparatus 3. The code converter units 41 convert the pattern data into unique codes with a small quantity. The converted unique codes are stored in the respective temporal memories.

In addition, when the stitchwork data is converted into unique codes, in addition to the conversion of the whole stitchwork data, the stitchwork data may be divided based on various references, and a piece may be converted into unique codes.

In the first embodiment, the "selected stitchwork data" and the "status data" are transmitted from the sewing machine 2 to the stitchwork status checking apparatus 3 through the TCP protocol and the UDP protocol, respectively, but the combination of the communication protocols is not limited to this example. That is, with respect to the "selected stitchwork data", communication protocols other than the TCP protocol are applicable as long as the data can be surely transmitted to the transmission destination. In addition, with respect to the "status data", communication protocols other than the UDP protocol are applicable as long as the data can be transmitted to the transmission destination within a short time.

Figure 11:
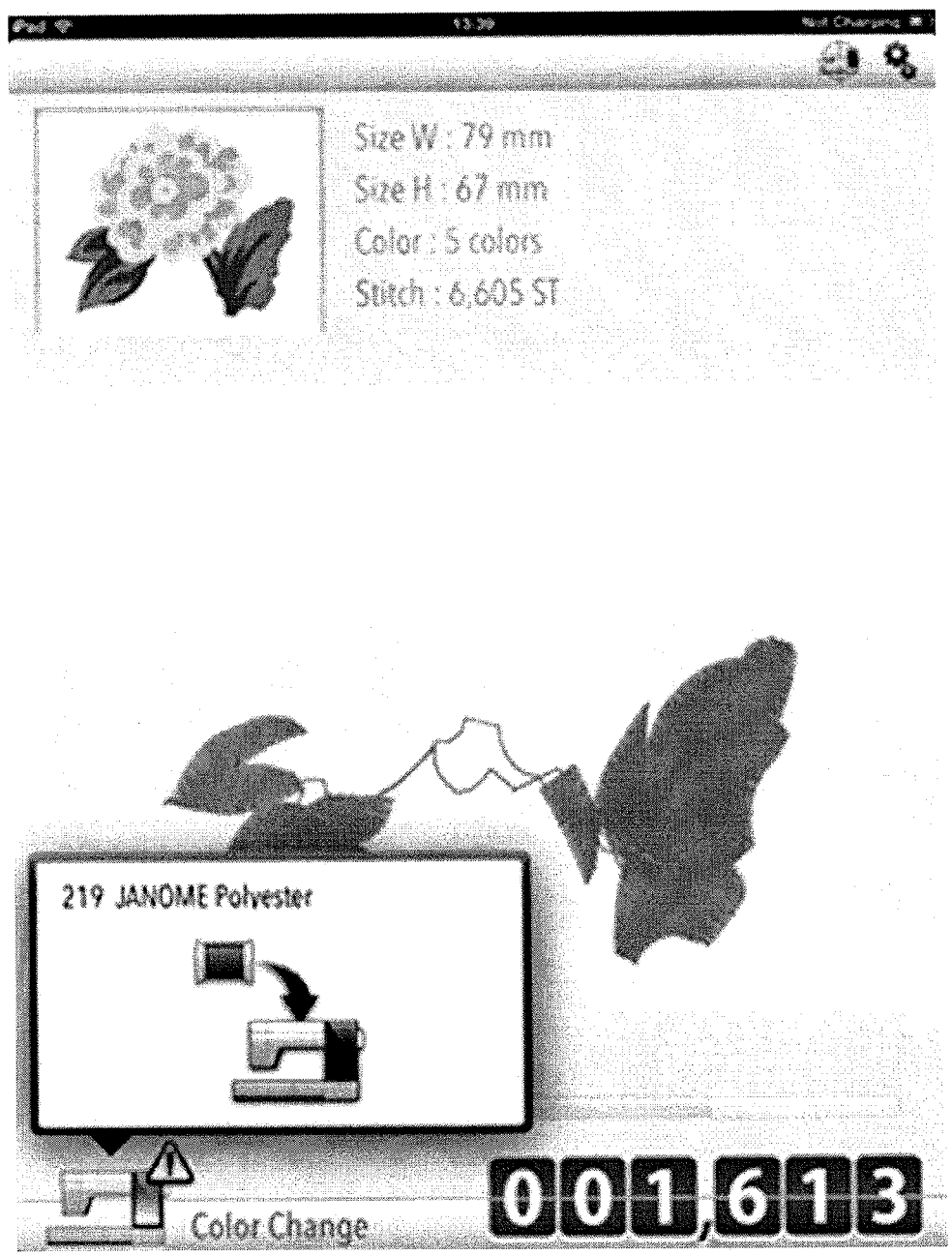
FIG. 11 is a diagram illustrating an example display of the stitchwork status checking apparatus according to another embodiment of the present disclosure.

Still further, the stitchwork status checking apparatus 3 may display, in addition to the stitchwork status by the sewing machine 2, events like a thread replacement as illustrated in FIG. 11. Example other events are snaggling of threads, and a deactivation of the sewing machine due to a thread break.

What is claimed is:

1. A stitchwork status checking apparatus that checks a stitchwork status of a stitchwork pattern selected and currently stitched by a sewing machine, the stitchwork status checking apparatus comprising:
- a stitchwork data receiver unit that receives stitchwork data on the stitchwork pattern currently stitched by the sewing machine;
- a converter unit that converts the received stitchwork data into a unique code;
- a status data receiver unit that receives a unique code converted based on the stitchwork data currently stitched by the sewing machine; and
- a code comparator unit that compares a code converted by the converter unit with a code received by the status data receiver unit, wherein:
- the stitchwork data receiver unit receives the stitchwork data through a transmission protocol that surely transmits data to a transmission destination; and
- the status data receiver unit receives the code through a transmission protocol that transmits data to a transmission destination within a short time.

2. The stitchwork status checking apparatus according to claim 1, wherein the unique code converted by the converter unit and the unique code converted based on the stitchwork data currently stitched by the sewing machine are each a CRC code.

3. The stitchwork status checking apparatus according to claim 1, further comprising a stitchwork data request unit that requests the stitchwork data currently stitched to the sewing machine when the code comparator unit determines that the two codes are inconsistent with each other.

4. The stitchwork status checking apparatus according to claim 1, wherein:
- the status data receiver unit receives status data containing the unique code converted based on the stitchwork data currently stitched by the sewing machine, and a number of stitches after the sewing machine starts stitching; and
- the stitchwork status checking apparatus further comprises a drawer unit that draws a stitchwork status by the sewing machine based on the stitchwork data stored in a memory, and the number of stitches after the sewing machine starts stitching when the code comparator unit determines that the two codes are consistent with each other.

5. The stitchwork status checking apparatus according to claim 4, wherein:
- the drawer unit stores the number of stitches contained in the status data every time the status data is received; and
- the stitchwork status checking apparatus further comprises a drawing speed setting unit that sets a drawing speed based on a difference in the number of stitches and a status data receiving cycle.

6. The stitchwork status checking apparatus according to claim 1, further comprising a status data request unit that requests the status data to the sewing machine at a predetermined cycle even if the status data receiver unit or the stitchwork data receiver unit receives no data.

7. A stitchwork status checking system comprising:
a sewing machine; and
a stitchwork status checking apparatus that checks a stitchwork status by the sewing machine,
wherein the stitchwork status checking apparatus comprises:
- a stitchwork data receiver unit that receives stitchwork data on a stitchwork pattern selected and currently stitched by the sewing machine;
- a converter unit that converts the received stitchwork data into a unique code;
- a status data receiver unit that receives a unique code converted based on the stitchwork data currently stitched by the sewing machine; and
- a code comparator unit that compares a code converted by the converter unit with a code received by the status data receiver unit,
- wherein the stitchwork data receiver unit receives the stitchwork data through a transmission protocol that surely transmits data to a transmission destination, and
- wherein the status data receiver unit receives the code through a transmission protocol that transmits data to a transmission destination within a short time.

8. A stitchwork status checking method for checking a stitchwork status of a stitchwork pattern selected and currently stitched by a sewing machine, the stitchwork status checking method comprising:
- a stitchwork data receiving step for receiving stitchwork data on the stitchwork pattern currently stitched by the sewing machine;
- a converting step for converting the received stitchwork data into a unique code;
- a status data receiving step for receiving a unique code converted based on the stitchwork data currently stitched by the sewing machine; and
- a code comparing step for comparing a code converted through the converting step with a code received through the status data receiving step, wherein:
- the stitchwork data receiving step receives the stitchwork data through a transmission protocol that surely transmits data to a transmission destination; and
- the status data receiving step receives the code through a transmission protocol that transmits data to a transmission destination within a short time.

9. A control program for a computer that controls a stitchwork status checking apparatus that checks a stitchwork status of a stitchwork pattern selected and currently stitched by a sewing machine, the control program causing the computer to execute:
- a stitchwork data receiving step for receiving stitchwork data on the stitchwork pattern currently stitched by the sewing machine;
- a converting step for converting the received stitchwork data into a unique code;
- a status data receiving step for receiving a unique code converted based on the stitchwork data currently stitched by the sewing machine; and
- a code comparing step for comparing a code converted through the converting step with a code received through the status data receiving step, wherein:
- the stitchwork data receiving step receives the stitchwork data through a transmission protocol that surely transmits data to a transmission destination; and
- the status data receiving step receives the code through a transmission protocol that transmits data to a transmission destination within a short time.

* * * * *